US010204185B2

(12) United States Patent
Mrowca et al.

(10) Patent No.: US 10,204,185 B2
(45) Date of Patent: Feb. 12, 2019

(54) BUILDING SCAN WINDOW DETECTION

(71) Applicant: INDOOR REALITY, Berkeley, CA (US)

(72) Inventors: Damian Mrowca, Stanford, CA (US); Avideh Zakhor, Berkeley, CA (US)

(73) Assignee: INDOOR REALITY INC., Berkeley, CA (US)

( * ) Notice: Subject to any disclaimer, the term of this patent is extended or adjusted under 35 U.S.C. 154(b) by 145 days.

(21) Appl. No.: 15/226,878

(22) Filed: Aug. 2, 2016

(65) Prior Publication Data

US 2018/0039713 A1 Feb. 8, 2018

(51) Int. Cl.
| G06F 17/50 | (2006.01) |
| G06T 15/06 | (2011.01) |
| G06K 9/00 | (2006.01) |
| G06T 19/00 | (2011.01) |
| G06T 19/20 | (2011.01) |

(52) U.S. Cl.
CPC ..... *G06F 17/5004* (2013.01); *G06K 9/00577* (2013.01); *G06T 15/06* (2013.01); *G06T 19/003* (2013.01); *G06T 19/20* (2013.01); *G06T 2210/04* (2013.01); *G06T 2219/2004* (2013.01); *G06T 2219/2016* (2013.01)

(58) Field of Classification Search
CPC ... G06F 17/5004; G06T 15/06; G06T 19/003; G06T 19/20; G06T 2219/2004; G06T 2219/2016; G06T 2210/04; G06K 9/00577
USPC .......................................................... 703/1
See application file for complete search history.

(56) References Cited

U.S. PATENT DOCUMENTS

2011/0262003 A1* 10/2011 Woo .................. G06K 9/6211
382/103
2018/0075648 A1* 3/2018 Moghadam ............ G06T 17/05

OTHER PUBLICATIONS

Turner. "3D Modeling of Interior Building Environments and Objects from Noisy Sensor Suites". May 14, 2015. Electrical Engineering and Computer Sciences University of California at Berkeley. 151 Pates.*
Pu et al. "Extracting Windows From Terrestrial Laser Scanning". ISPRS Workshop on Laser Scanning 2007 and SilviLaser 2007, Espoo, Sep. 12-14, 2007, Finland. 7 Pages.*

(Continued)

*Primary Examiner* — Eunhee Kim
(74) *Attorney, Agent, or Firm* — Kali Law Group, P.C.

(57) ABSTRACT

Methods for detecting a windows in a building utilizing a building scan using an electronic computing device are presented, the methods including: causing the electronic computing device to receive the building scan; processing the building scan; detecting the windows based on no return transparency of portions of the building scan; and incorporating the detected windows into a 3D model corresponding with the building scan. In some embodiments, processing the building scan generates at least the following: a colored point cloud; a 2D floor plan of the building; and a walked path. In some embodiments, detecting the windows based on transparency of a portions of the building scan further includes: decomposing the colored point cloud into walls; rotating and pixilating the walls; extracting transparent features corresponding with the windows; and classifying and smoothing the transparent features corresponding with the windows.

16 Claims, 7 Drawing Sheets

(56) References Cited

OTHER PUBLICATIONS

Lee et al. "Extraction and Integration of Window in a 3D Building Model from Ground View images". Proceedings of the 2004 IEEE Computer Society Conference on Computer Vision and Pattern Recognition (CVPR'04) 1063-6919/04. 8 Pages.*
Liu et al. "Rent3D: Floor-Plan Priors for Monocular Layout Estimation". IEEE 2015. p. 3413-3421.*
Zhang et al., "Automatic Identification of Window Regions on Indoor Point Clouds Using LiDAR and Cameras," IEEE Winter Conference on Applications of Computer Vision, Steamboat Springs, CO, Mar. 2014, pp. 1-8.

* cited by examiner

BUILDING SCAN WINDOW DETECTION

BACKGROUND

Computerized 3D modeling for building architecture has become the de facto standard for designing, construction, operating, maintaining, and remodeling of buildings. Operating and maintaining, for example, benefit greatly from a 3D model that semantically identifies windows, lights, and plug loads. Indeed, this type of information is a critical element in effectively determining overall energy consumption. For new construction, 3D digital Computer Aided Design (CAD) drawings are readily available. For older buildings however, 3D architectural models either are missing, or are not up to date due to multiple remodeling and changes that have not been documented over the years. In these situations, it is important to first recover a 3D architectural model of the building to accurately assess energy consumption due to the number and size of windows.

As such, building scan window detection methods are presented herein.

BRIEF SUMMARY

The following presents a simplified summary of some embodiments of the invention in order to provide a basic understanding of the invention. This summary is not an extensive overview of the invention. It is not intended to identify key/critical elements of the invention or to delineate the scope of the invention. Its sole purpose is to present some embodiments of the invention in a simplified form as a prelude to the more detailed description that is presented below.

Methods for detecting a windows in a building utilizing a building scan using an electronic computing device are presented, the methods including: causing the electronic computing device to receive the building scan; processing the building scan; detecting the windows based on no return transparency of portions of the building scan; and incorporating the detected windows into a 3D model corresponding with the building scan. In some embodiments, processing the building scan generates at least the following: a colored point cloud; a 2D floor plan of the building; and a walked path. In some embodiments, detecting the windows based on transparency of a portions of the building scan further includes: decomposing the colored point cloud into walls; rotating and pixilating the walls; extracting transparent features corresponding with the windows; and classifying and smoothing the transparent features corresponding with the windows. In some embodiments, decomposing the colored point cloud into walls further includes: extruding the walls from the 2D floor plan; determining a scan location of each point in the colored point cloud; and ray tracing each point to at least one of the walls. In some embodiments, rotating and pixilating the walls further includes: rotating each of the walls to view from a front view; and pixilating each of the walls from the front view.

In some embodiments, extracting the transparent features corresponding with the windows further includes: determining rays that intersect each pixel corresponding with the pixilated walls; counting any of the rays with no return; and returning a count corresponding with the counting in a pixel matrix. In some embodiments, classifying and smoothing features corresponding with the windows further include: applying conditional random field to provide a classification of each pixel corresponding with the pixilated walls based on the features of each pixel and surrounding each pixel; and outputting the classification in a pixel matrix. In some embodiments, incorporating the detected windows into a 3D model corresponding with the building scan further includes: selecting and regularizing the detected windows. In some embodiments, selecting and regularizing the detected windows further includes: rectifying the detected window areas; filtering the detected windows; fusing any of the detected windows that overlap; and splitting and of the detected windows that are oversized. In some embodiments, classifying and smoothing features corresponding with the windows further include: convolving each of the walls utilizing matched linear matching to provide a classification of each pixel corresponding with the pixilated walls based on the features of each pixel and surrounding each pixel; and outputting the classification in a pixel matrix. In some embodiments, incorporating the detected windows into a 3D model corresponding with the building scan further includes: façade regularizing the detected windows. In some embodiments, façade regularizing the detected windows further includes: regularizing each of the detected windows to a selected shape; aligning the detected windows vertically for each of a floors of the building; aligning the detected windows horizontally across the floors; and redistributing the detected windows to meet an average window-to-wall ration per room.

In other embodiments, computing device program products for detecting a windows in a building utilizing a building scan using a computing device are presented, the computing device program products including: a non-transitory computer readable medium; first programmatic instructions for causing the computing device to receive the building scan; second programmatic instructions for processing the building scan; third programmatic instructions for detecting the windows based on no return transparency of a portions of the building scan; and fourth programmatic instructions for incorporating the detected windows into a 3D model corresponding with the building scan where the fourth programmatic instructions for incorporating the detected windows into a 3D model corresponding with the building scan further includes: selecting and regularizing the detected windows, wherein the programmatic instructions are stored on the non-transitory computer readable medium. In some embodiments, the second programmatic instructions for processing the building scan generates at least the following: a colored point cloud; a 2D floor plan of the building; and a walked path. In some embodiments, the third programmatic instructions for detecting the windows based on transparency of a portions of the building scan further includes: fifth programmatic instructions for decomposing the colored point cloud into walls; sixth programmatic instructions for rotating and pixilating the walls; seventh programmatic instructions for extracting a transparent features corresponding with the windows; and eighth programmatic instructions for classifying and smoothing the transparent features corresponding with the windows. In some embodiments, where the seventh programmatic instructions for extracting the transparent features corresponding with the windows further includes: determining rays that intersect each pixel corresponding with the pixilated walls; counting any of the rays with no return; and returning a count corresponding with the counting in a pixel matrix.

The features and advantages described in the specification are not all inclusive and, in particular, many additional features and advantages will be apparent to one of ordinary skill in the art in view of the drawings, specification, and claims. Moreover, it should be noted that the language used in the specification has been principally selected for readability and instructional purposes, and may not have been selected to delineate or circumscribe the inventive subject matter.

BRIEF DESCRIPTION OF THE SEVERAL VIEWS OF THE DRAWINGS

The present invention is illustrated by way of example, and not by way of limitation, in the figures of the accompanying drawings and in which like reference numerals refer to similar elements and in which.

DETAILED DESCRIPTION

Figure 1:
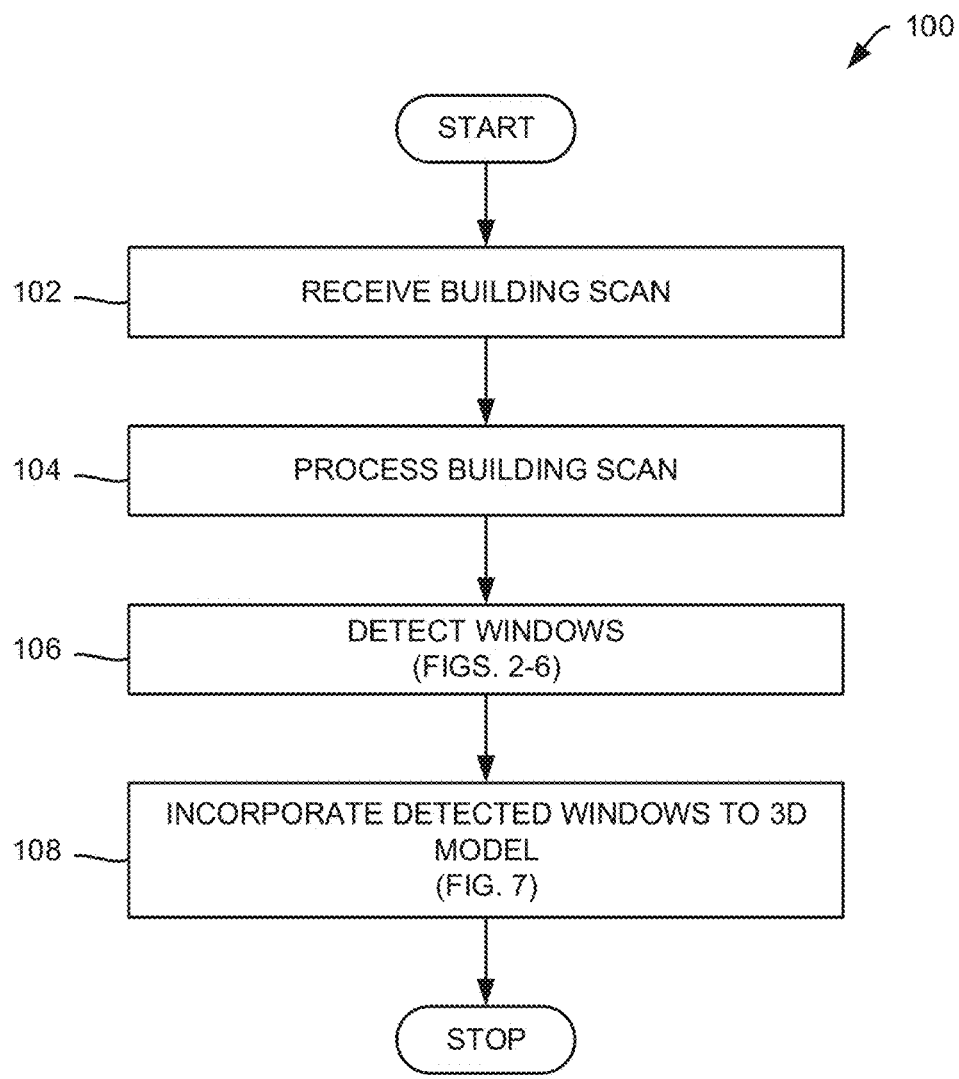
FIG. 1 is an illustrative overview flowchart of methods for window detection and incorporation to a 3D model in accordance with embodiments of the present invention.

As will be appreciated by one skilled in the art, the present invention may be a system, a method, and/or a computer program product. The computer program product may include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing.

A computer readable storage medium, as used herein, is not to be construed as being transitory signals/per se/, such as radio waves or other freely propagating electromagnetic waves, electromagnetic waves propagating through a waveguide or other transmission media (e.g., light pulses passing through a fiber-optic cable), or electrical signals transmitted through a wire. Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks. The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

FIG. 1 is an illustrative overview flowchart 100 of methods for window detection and incorporation to a 3D model in accordance with embodiments of the present invention. As such, at a first step 102, the method receives a building scan. Examples of building scans suitable for input into methods disclosed herein may be found in U.S. patent application Ser. No. 14/947,869 entitled, "METHODS FOR INDOOR 3D SURFACE RECONSTRUCTION AND 2D FLOOR PLAN RECOVERY UTILIZING SEGMENTATION OF BUILDING AND OBJECT ELEMENTS," which is incorporated herein by reference. Upon receiving a building scan, the method continues to a step 104 to process the building scan which may generate data such as: a colored point cloud including xyz coordinates, RGB color, and timestamps; a 2D floor plan of the building corresponding with the building scan including 2D positions of all vertices of all walls, height of floor and ceiling per room, designation of interior and exterior wall; and a walked path of the building scan including positions, orientations, and timestamps for each scanned point in time. In addition, information such as backpack configuration including positions and orientations of all sensors of a backpack scanner may be included. At a next step 106, the method detects windows. Window detection will be discussed in further detail below for FIGS. 2-6. In short, methods provided herein detect and classify windows based on no return transparency of walls of the building scan. The method continues to a step 108 to incorporate detected windows to a 3D model, whereupon the method ends. Incorporating detected windows to a 3D model will be discussed in further detail below for FIG. 7.

Figure 2:
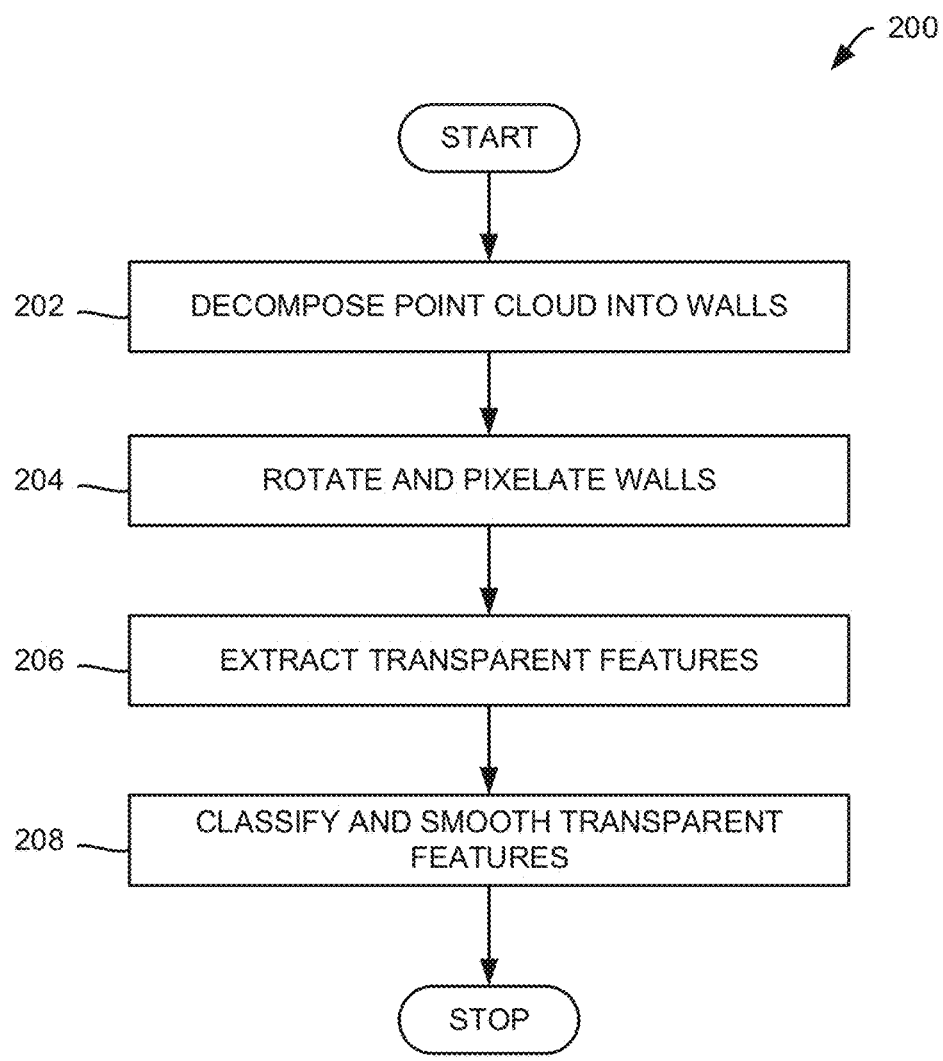
FIG. 2 is an illustrative overview flowchart of methods for window detection in accordance with embodiments of the present invention.

FIG. 2 is an illustrative overview flowchart 200 of methods for window detection in accordance with embodiments of the present invention. At a first step 202, the method decomposes a colored point cloud into walls. In general, methods utilize ray tracing to assign every point of the input colored point cloud to one of the walls described by the input floor plan. As utilized herein, all walls are assumed to be flat rectangular planes. A step 202 will be discussed in further detail below for FIG. 3. At a next step 204, the method rotates and pixilates walls. In general, methods rotate the walls to in order to look at the walls from the front and then pixelate the walls to in order to apply image processing algorithms. A step 204 will be discussed in further detail below for FIG. 4. Methods continue to a step 206 to extract transparent features. In general, methods count all points with rays of no return per pixel. That is, rays that don't stop on any wall or on any object thereafter and thus return no signal to the laser scanner. A step 206 will be discussed in further detail below for FIG. 5. At a next step 208, the method classifies and smoothes transparent features, whereupon the method ends. In general, each transparent feature is classified on a per pixel basis using its surrounding features. A step 208 will be discussed in further detail below for FIG. 6.

Figure 3:
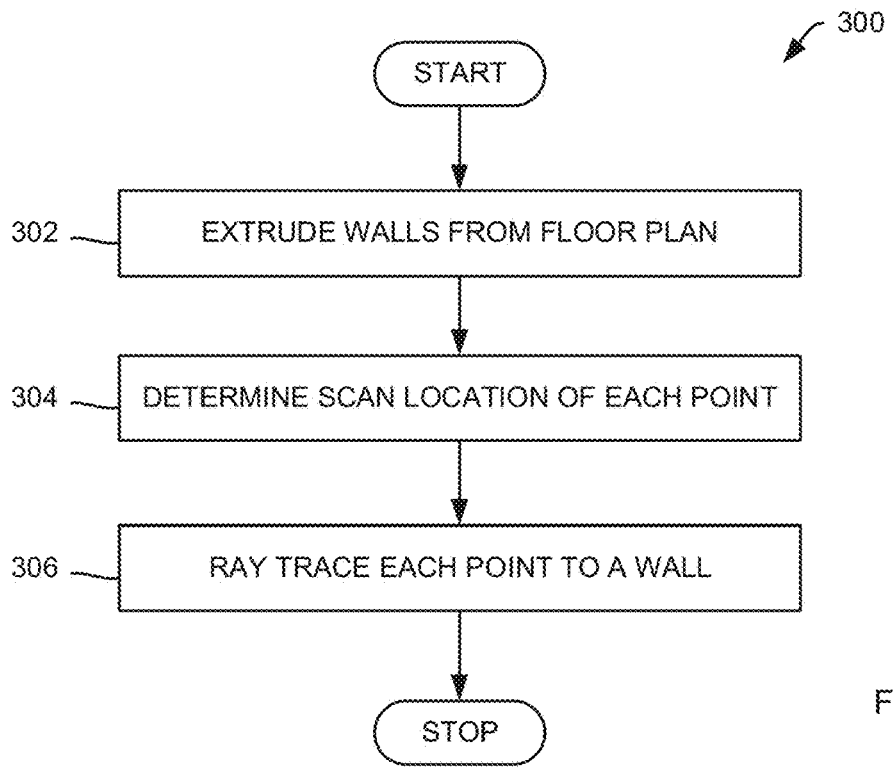
FIG. 3 is an illustrative flowchart of methods for decomposing a point cloud into walls in accordance with embodiments of the present invention.
Figure 8:
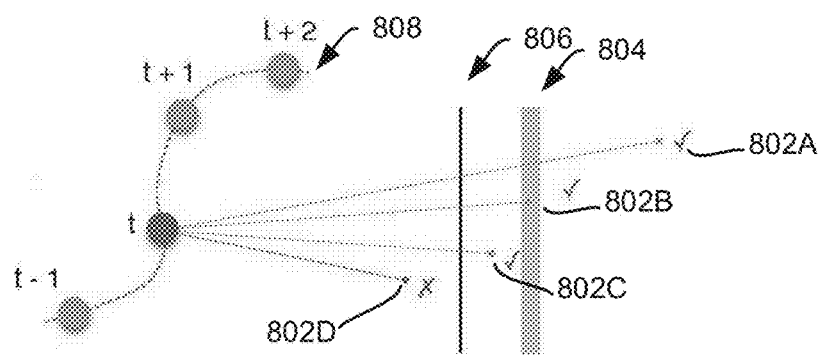
FIG. 8 is an illustrative representation of assignment of a point cloud to a wall in accordance with embodiments of the present invention.

FIG. 3 is an illustrative flowchart 300 of methods for decomposing a point cloud into walls in accordance with embodiments of the present invention. In particular, flowchart 300 further describes a step 202 (FIG. 2). As noted above, methods utilize ray tracing to assign every point of the input colored point cloud to one of the walls described by the input floor plan. As utilized herein, all walls are assumed to be flat rectangular planes. As such, at a step 302, the method extrudes walls from a floor plan. In embodiments, the vertices determine the position of the extruded walls in the 3D space while heights of the floor and ceiling determine the vertical boundaries of the extruded walls. At a next step 304, methods determine a scan location of each point in the input colored point cloud. In order to determine the scan location, an input path and input backpack configuration may be utilized. At a next step 306, the method ray traces each point to a wall, whereupon the method ends. That is, a ray may be spanned between the point of interest and its corresponding scan location This ray is used to assign the point to the correct wall. Essentially, each point is assigned to the wall which is hit first by its ray. Only points surpassing a defined threshold distance in front of the wall are assigned to the wall. Turning to FIG. 8, FIG. 8 is an illustrative representation of assignment of point cloud (points 802A to 802C) to wall 804 in accordance with embodiments of the present invention. As illustrated, only points (802A, 802B, and 802C) whose rays surpass the assignment threshold in front of the wall are assigned to wall 804. Points (802D) whose rays end in front of the assignment threshold 806 are not assigned to the wall. Locations t−1, t, t+1, t+2 are scan locations at different timestamps along walking path 808. A result of decomposing is a set of walls each composed from a subset of point from the input colored point cloud.

Figure 4:
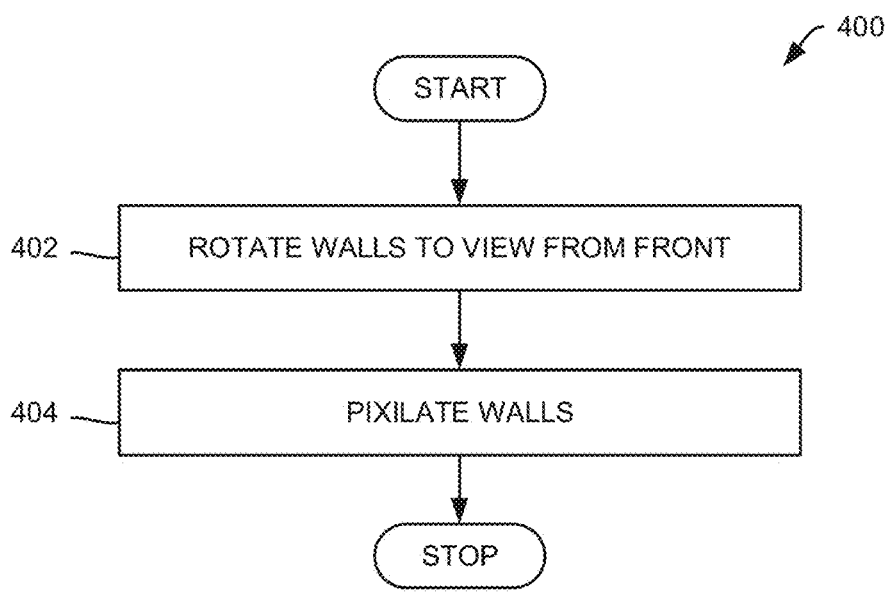
FIG. 4 is an illustrative flowchart of methods for rotating and pixilating walls in accordance with embodiments of the present invention.
Figure 9:
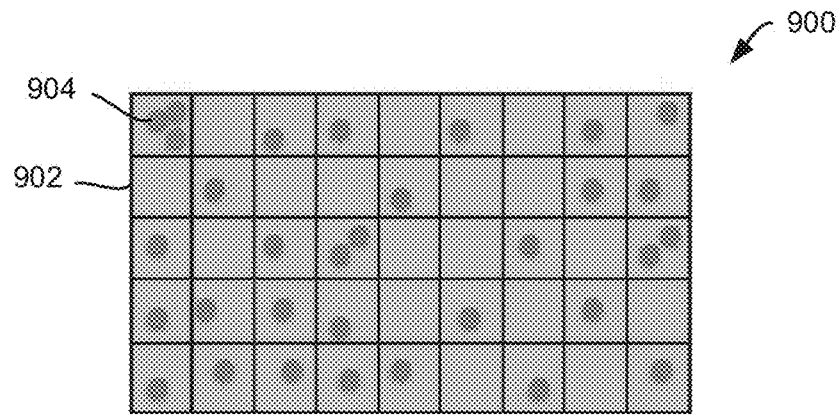
FIG. 9 is an illustrative representation of a wall after rotating and pixilating accordance with embodiments of the present invention.

FIG. 4 is an illustrative flowchart 400 of methods for rotating and pixilating walls in accordance with embodiments of the present invention; In particular, flowchart 400 further describes a step 204 (FIG. 2). As noted above, methods rotate the walls to in order to look at the walls from the front and then pixelate the walls to in order to apply image processing algorithms. As such at a first step 402, the method rotates walls to view from the front such that the wall surfaces points directly at the view point. At a next step 404, the method pixilates the walls. That is, each walls may be divided into equal pixels of a specified size. Each point may then be binned to a pixel depending of the intersection point of its ray and the wall plane. Turning to FIG. 9, FIG. 9 is an illustrative representation of a wall 900 after rotating and pixilating accordance with embodiments of the present invention. As illustrated, each point 904 may be binned to a pixel 902 depending of the intersection point of its ray and the wall plane.

Figure 5:
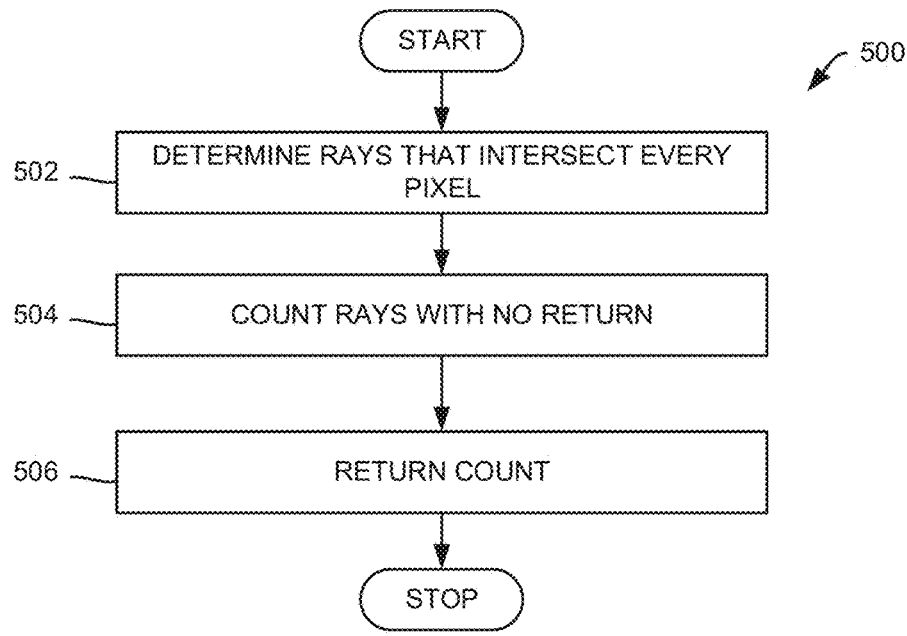
FIG. 5 is an illustrative flowchart of methods for extracting transparent features in accordance with embodiments of the present invention.

FIG. 5 is an illustrative flowchart 500 of methods for extracting transparent features in accordance with embodiments of the present invention; In particular, flowchart 500 further describes a step 206 (FIG. 2). As noted above, methods count all points with rays of no return per pixel. That is, rays that don't stop on any wall or on any object thereafter and thus return no signal to the laser scanner. Methods presented herein assume that the number of rays with no return per pixel indicates how transparent this pixel is. In other words, if all rays that intersect with a pixel of a wall have no return point, all of these rays go through the pixel and thus it is very likely that this pixel is transparent and, therefore, a window. If all rays that intersect with a pixel of a wall end on the wall surface, this pixel is very likely opaque and not transparent. This feature may be particularly useful if the used floor plan is not accurate. As points with rays of no return can be assumed to end at infinity a slight translation of the wall in either direction won't significantly change the intersection point of the infinite ray and a pixel of the wall. This means that this feature is very robust to the positioning of the walls which enables the usage of less accurate floor plans. As such, at a step 502, the method determines all rays that intersect each pixel corresponding with the pixilated walls. At a next step 504, the method counts the rays having no return. When using a laser scanner with backpack configurations disclosed above, the method identifies those rays for which the laser scanner returns no distance. At a next step 506, the method returns the count of ray to a pixel matrix.

Figure 6:
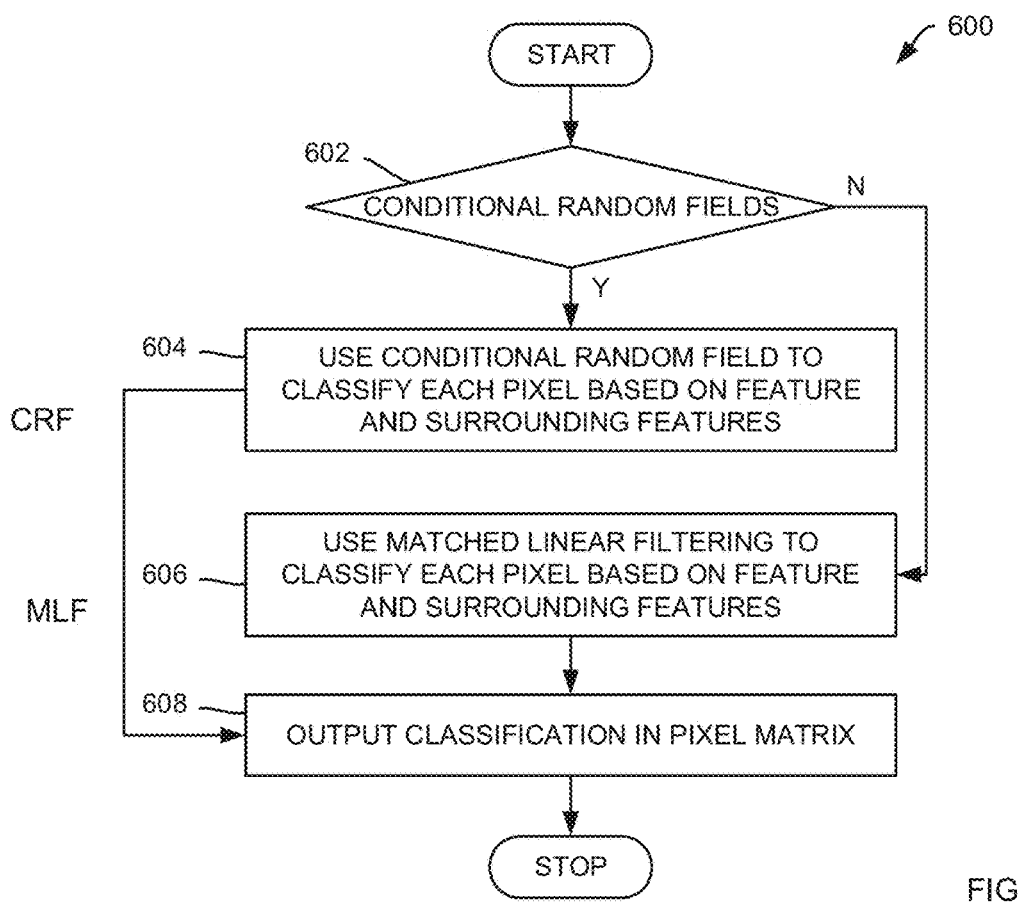
FIG. 6 is an illustrative flowchart of methods for classifying and smoothing transparent features in accordance with embodiments of the present invention.
Figure 10:
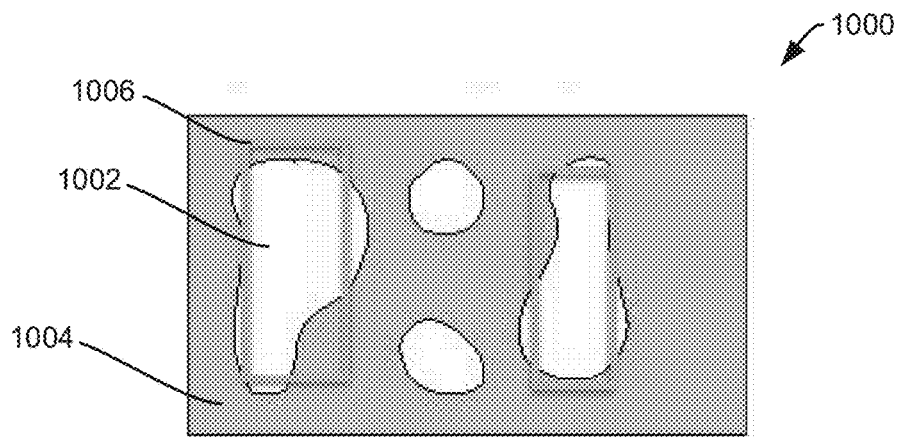
FIG. 10 is an illustrative representation of rectifying windows after utilizing conditional random fields in accordance with embodiments of the present invention

FIG. 6 is an illustrative flowchart 600 of methods for classifying and smoothing transparent features in accordance with embodiments of the present invention; In particular, flowchart 600 further describes a step 208 (FIG. 2). Methods disclosed herein utilize two different classification/smoothing methods during the window detection: A) conditional random field and B) matched linear filtering. Conditional random fields output arbitrary non-rectangular shapes that may be rectified into rectangular windows while matched linear filtering produces regular classification regions all of the same shape and size. Since only one classification/smoothing method may be utilized at a time, selection of which method to use by a user may be based on the particular strengths of each. So, whereas conditional random fields may be desirable if the facades and shapes of the windows of a building are highly diverse and differ significantly, matched linear filtering may be desirable for regular buildings with regular facades with windows all of the same size. As such, at a step 602, the method determines whether conditional random fields should be utilized. If at a step 602, the method determines that conditional random fields should be applied, the method continues to a step 604 to apply conditional random fields to classify each pixel based on the pixel's feature and on the surrounding features. The method continues to a step 608 to output classification in a pixel matrix. Turning to FIG. 10, FIG. 10 is an illustrative representation 1000 of rectifying windows after utilizing conditional random fields in accordance with embodiments of the present invention. As illustrated, window area 1002 has been classified area utilizing conditional random field as indicated by the arbitrary shape. Wall area 1004 has also been classified. Bounding boxes 1006 with the same surface area as window areas may be placed at the center of mass of the window area 1002. Areas that do not satisfy the requirements for windows, such as too small or too narrow areas are filtered and ignored.

Figure 11:
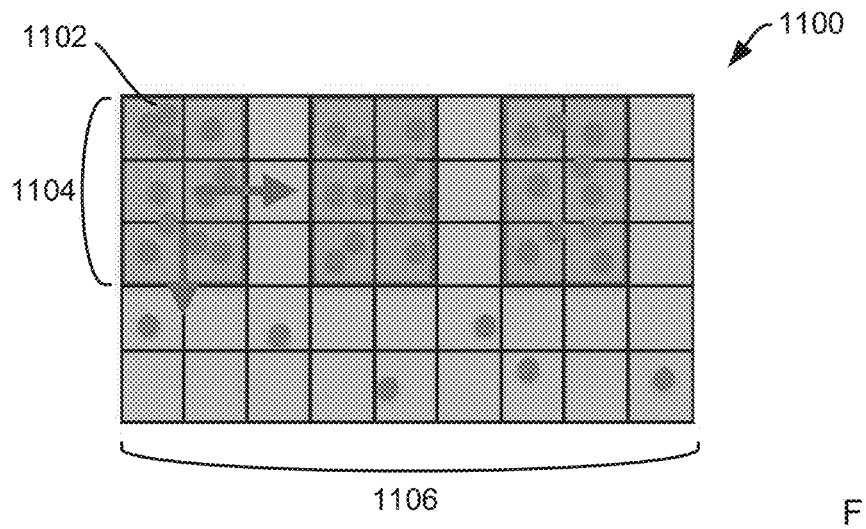
FIG. 11 is an illustrative representation of utilizing matched linear filtering in accordance with embodiments of the present invention.

Returning to FIG. 6, if at a step 602, the method determines that conditional random fields should not be utilized, the method continues to a step 606 to convolve all walls utilizing matched linear filtering to classify each pixel based on the pixel's feature and on the surrounding features. The method continues to a step 608 to output classification in a pixel matrix. Turning to FIG. 11, FIG. 11 is an illustrative representation 1100 of utilizing matched linear filtering in accordance with embodiments of the present invention. As illustrated, matched filter 1104 with the same size as the searched windows may be convolved with the whole pixilated wall 1106. Here, dots 1102 indicate points whose rays went through the wall. Those areas are classified as windows by the filter 1104 that have more than the detection threshold rays that went through the wall. In the above example the threshold is 8. Hence all matched filter locations with more than 8 rays that went through the wall are classified as windows.

Figure 7:
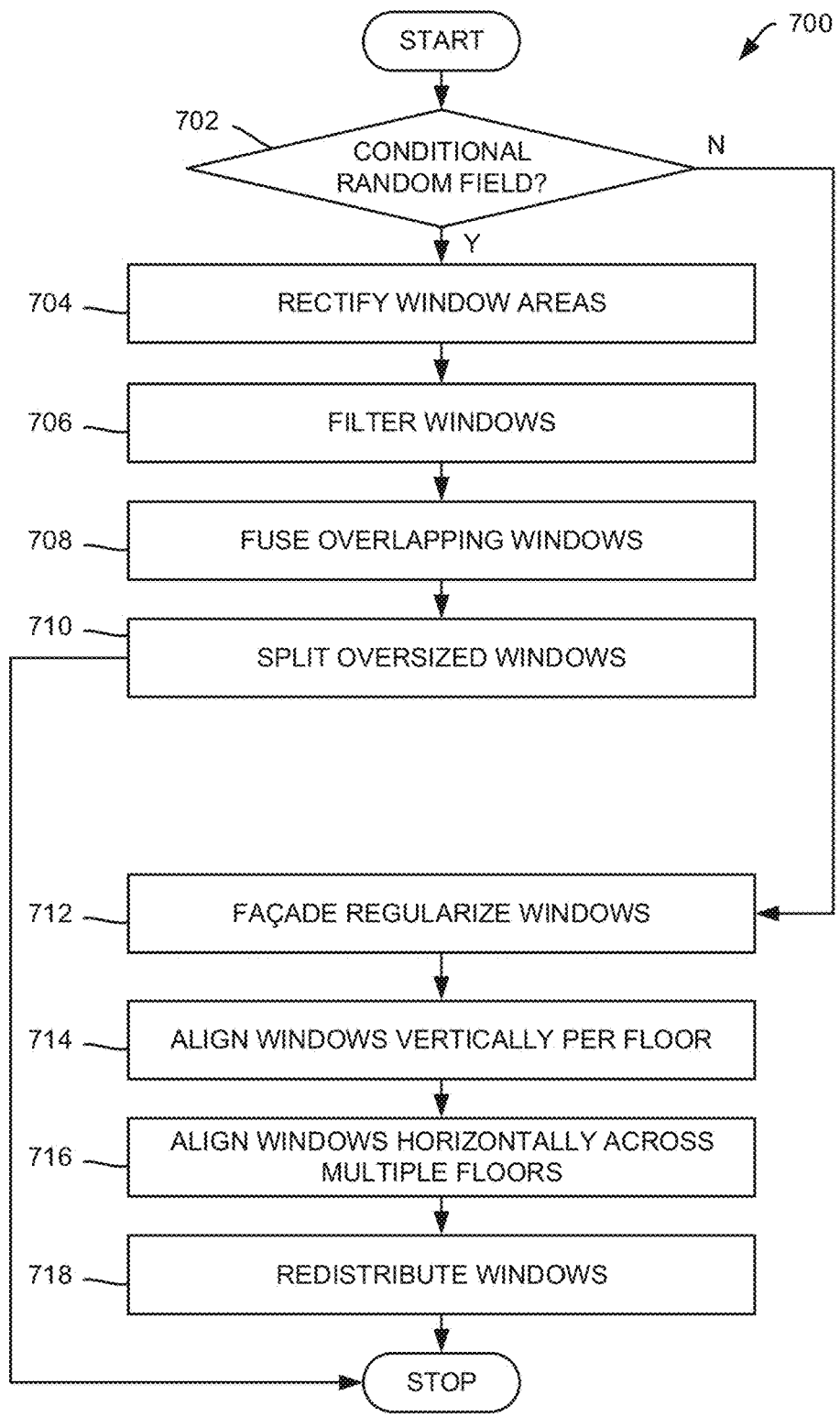
FIG. 7 is an illustrative flowchart of methods for incorporating detected windows into a 3D model.

FIG. 7 is an illustrative flowchart 700 of methods for incorporating detected windows into a 3D model. In particular, flowchart 700 further describes a step 108 (FIG. 1). As noted above, conditional random fields may be desirable if the facades and shapes of the windows of a building are highly diverse and differ significantly while matched linear filtering may be desirable for regular buildings with regular facades with windows all of the same size. As such, at a step 702 the method determines whether conditional random fields were utilized. If, at a step 702, the method determines that conditional random fields were utilized, the method continues to steps 704 to 710 to select and regularize windows using parameters such as: per pixel classification, either labeled as window or wall; minimum window area; minimum window width; minimum window height; minimum window depth; minimum window gap; target window width; and target window height. As such, at a step 704, the method rectifies window areas. Using the per pixel classification input windows may be identified by fitting rectangular bounding boxes around the detected window regions. A window region may be defined as all directly connected pixels that were labeled as windows. For each window region a bounding box of the same area as the window region may be fitted at the center of mass of the window region. In this manner, arbitrary shaped window regions may be transformed into rectangular windows that preserve the position and area of the window regions as well as possible. An example of this procedure may be seen in FIG. 10.

At a next step 706, the method filters the windows. Any number of filters may be utilized in embodiments. In some embodiments window may be filtered in accordance with the following:

Filter windows based on minimal area: Based on the specified minimal area, windows may be removed from the set whose area is too small;

Filter windows based on minimal width: Based on the specified minimal width, windows may be removed from the set whose width is too small;

Filter windows based on minimal height: Based on the specified minimal height, windows may be removed from the set whose height is too small; and Filter windows based on minimal depth: Based on the specified minimal depth, windows may be removed from the set whose average depth across the window pixels is too small.

At a next step 708, the method fuses overlapping windows. Overlapping windows may be fused into one window by replacing the overlapping window with a rectangular window of the same area at the center of mass of the overlapping window regions. During rectification, the mean aspect ratio between height and width of original windows may be preserved. At a next step 710, the method splits oversized windows. Occasionally, window detection regions of two separate windows but close windows might overlap. In these cases, the one coherent detection region may be split into multiple detection regions that are approximately the same size as the target window size. Splitting may be accomplished by splitting the coherent detection region bounding box into boxes of the same size as the target window size. Remainders of the bounding box region that are smaller than the target window size are not dilated to the target window size but instead may be filtered and ignored. In this manner, the result may be multiple windows over one coherent window region that might have been otherwise been interpreted as one large window.

Returning to a step 702, if, at a step 702, the method determines that conditional random fields were not utilized, the method continues to steps 712 to façade regularize windows. In embodiments, facade regularization is only used with matched linear filtering as it targets regular buildings with regular facades with windows all of the same size and shape although in some embodiments, window size may be individually selected or determined by a user for each façade. Goals of the façade regularization may be to a) align all windows vertically per floor, b) align all windows horizontally across floors and c) redistribute the windows such that each room meets an average window-to-wall ratio. As such at a step 714, the method aligns windows vertically per floor. That is, all windows may start and end at the same vertical position. Therefore the average vertical position of all windows may be determined and all windows may be placed at this average vertical position. The horizontal position remains unchanged. At a next step 716, the method aligns windows horizontally across multiple floors. That is, all windows may start and end at the same horizontal position. Therefore, the average horizontal gap between windows may be calculated. The horizontal gap may then be used to define a regular grid spacing in the horizontal direction. First, the position of this regular grid may be fit as good as possible into the initial position of the windows by minimizing the sum of the distances between the window positions and its closest grid locations. Then, the windows positions may be fit into the grid by moving the windows into the grid locations. By doing this the windows may be aligned horizontally across all floors of a facade. At next step 718, the method redistributes windows to meet an average window-to-wall ratio per room. In implementing methods disclosed herein, there may be circumstances where the number of windows in one room wall may be overestimated or underestimates. As such, methods may redistribute all windows such that the average window-to-wall ratio is about the same per room wall. In other words, the average window-to-wall ratio may be utilized to detect overestimation and underestimation per room wall. Therefore, embodiments may calculate an average window to wall ratio for a whole facade by determining the total window and wall area. In addition, the window-to-wall ratio for each room wall of the façade may be calculated. Then, methods may compare the window-to-wall ratio of each room wall of the facade to the window-to-wall of the entire facade to determine whether the number of windows are overestimated or underestimated. Single windows may be added to overestimated room walls removed from underestimated room walls until the window-to-wall ratio of each room wall of the façade closely matches the window-to-wall ratio of the entire facade. In this manner, a regular facade in which the window-to-wall ratio for each room is more accurate may be obtained.

Figure 12:
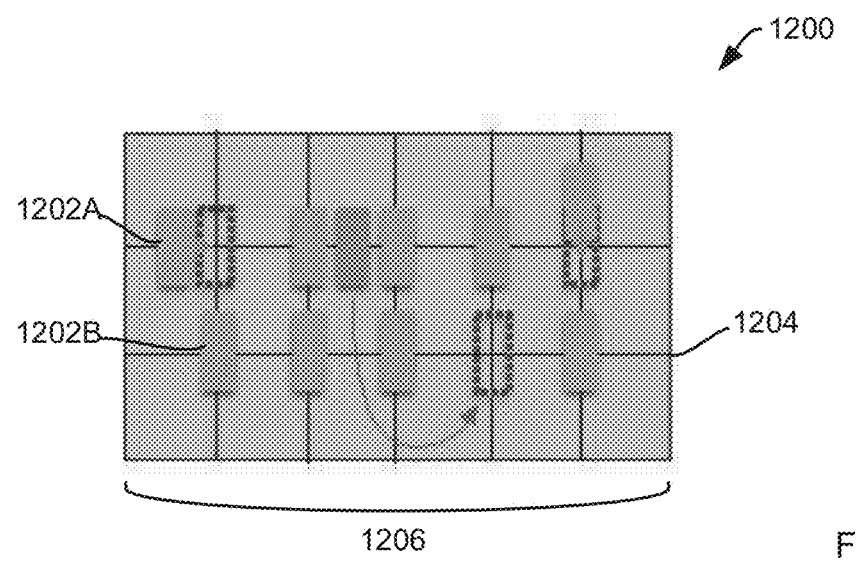
FIG. 12 is an illustrative representation of regularizing a façade in accordance with embodiments of the present invention.

An example of window façade regularization is found at FIG. 12, which is an illustrative representation of regularizing a façade in accordance with embodiments of the present invention. It may be desirable to position all windows 1202A . . . 1202B on a regular grid 1204 that assures that all windows are aligned vertically per floor and horizontally across floors on a facade 1206. Further windows may be redistributed such that the window-to-wall ratio of all rooms equals the average window-to-wall ratio of the facade. Thus, single windows with too many windows may be removed and single windows in rooms with too few windows may be added.

The terms "certain embodiments", "an embodiment", "embodiment", "embodiments", "the embodiment", "the embodiments", "one or more embodiments", "some embodiments", and "one embodiment" mean one or more (but not all) embodiments unless expressly specified otherwise. The terms "including", "comprising", "having" and variations thereof mean "including but not limited to", unless expressly specified otherwise. The enumerated listing of items does not imply that any or all of the items are mutually exclusive, unless expressly specified otherwise. The terms "a", "an" and "the" mean "one or more", unless expressly specified otherwise.

While this invention has been described in terms of several embodiments, there are alterations, permutations, and equivalents, which fall within the scope of this invention. It should also be noted that there are many alternative ways of implementing the methods, computer program products, and apparatuses of the present invention. Furthermore, unless explicitly stated, any method embodiments described herein are not constrained to a particular order or sequence. Further, the Abstract is provided herein for convenience and should not be employed to construe or limit the overall invention, which is expressed in the claims. It is therefore intended that the following appended claims be interpreted as including all such alterations, permutations, and equivalents as fall within the true spirit and scope of the present invention.

What is claimed is:

1. A method for detecting a plurality of windows in a building utilizing a building scan using an electronic computing device, the method comprising:

causing the electronic computing device to receive the building scan;
processing the building scan;
detecting the plurality of windows based on no return transparency of a plurality of portions of the building scan, wherein the detecting the plurality of windows based on transparency of a plurality of portions of the building scan comprises:
  decomposing the colored point cloud into a plurality of walls;
  rotating and pixilating the plurality of walls;
  extracting a plurality of transparent features corresponding with the plurality of windows; and
  classifying and smoothing the plurality of transparent features corresponding with the plurality of windows, wherein the classifying and smoothing features corresponding with the plurality of windows comprises:
    convolving each of the plurality of walls utilizing matched linear matching to provide a classification of each pixel corresponding with the pixilated plurality of walls based on the plurality of features of each pixel and surrounding each pixel; and
    outputting the classification in a pixel matrix; and
  incorporating the detected plurality of windows into a 3D model corresponding with the building scan.

2. The method of claim 1, wherein the processing the building scan generates at least the following:
  a colored point cloud;
  a 2D floor plan of the building; and
  a walked path.

3. The method of claim 1, wherein the decomposing the colored point cloud into the plurality of walls further comprises:
  extruding the plurality of walls from the 2D floor plan;
  determining a scan location of each point in the colored point cloud; and
  ray tracing each point to at least one of the plurality of walls.

4. The method of claim 1, wherein the rotating and pixilating the plurality of walls further comprises:
  rotating each of the plurality of walls to view from a front view; and
  pixilating each of the plurality of walls from the front view.

5. The method of claim 1, wherein the extracting the plurality of transparent features corresponding with the plurality of windows further comprises:
  determining a plurality of rays that intersect each pixel corresponding with the pixilated plurality of walls;
  counting any of the plurality of rays with no return; and
  returning a count corresponding with the counting in a pixel matrix.

6. The method of claim 1, wherein the classifying and smoothing features corresponding with the plurality of windows further comprise:
  applying conditional random field to provide a classification of each pixel corresponding with the pixilated plurality of walls based on the plurality of features of each pixel and surrounding each pixel; and
  outputting the classification in a pixel matrix.

7. The method of claim 6, wherein the incorporating the detected plurality of windows into a 3D model corresponding with the building scan further comprises:
  selecting and regularizing the plurality of detected windows.

8. The method of claim 7, wherein the selecting and regularizing the plurality of detected windows further comprises:
  rectifying the plurality of detected window areas;
  filtering the plurality of detected windows;
  fusing any of the plurality of detected windows that overlap by replacing an overlapping window with a rectangular window of a same area at a center of mass of the overlapping window; and
  splitting and of the plurality of detected windows that are oversized by splitting a coherent detection region bounding box into boxes of a same size as a target window size.

9. The method of claim 1, wherein the incorporating the detected plurality of windows into a 3D model corresponding with the building scan further comprises:
  façade regularizing the plurality of detected windows.

10. The method of claim 9, wherein the façade regularizing the plurality of detected windows further comprises:
  regularizing each of the plurality of detected windows to a selected shape;
  aligning the plurality of detected windows vertically for each of a plurality of floors of the building;
  aligning the plurality of detected windows horizontally across the plurality of floors; and
  redistributing the plurality of detected windows to meet an average window-to-wall ration per room.

11. A computing device program product for detecting a plurality of windows in a building utilizing a building scan using a computing device, the computing device program product comprising:
  a non-transitory computer readable medium;
  first programmatic instructions for causing the computing device to receive the building scan;
  second programmatic instructions for processing the building scan;
  third programmatic instructions for detecting the plurality of windows based on no return transparency of a plurality of portions of the building scan, wherein the third programmatic instructions for detecting the plurality of windows based on transparency of a plurality of portions of the building scan comprises:
    fifth programmatic instructions for decomposing the colored point cloud into a plurality of walls;
    sixth programmatic instructions for rotating and pixilating the plurality of walls;
    seventh programmatic instructions for extracting a plurality of transparent features corresponding with the plurality of windows; and
    eighth programmatic instructions for classifying and smoothing the plurality of transparent features corresponding with the plurality of windows, wherein the eighth programmatic instructions for classifying and smoothing features corresponding with the plurality of windows comprises:
      convolving each of the plurality of walls utilizing matched linear matching to provide a classification of each pixel corresponding with the pixilated plurality of walls based on the plurality of features of each pixel and surrounding each pixel; and
      outputting the classification in a pixel matrix; and
  fourth programmatic instructions for incorporating the detected plurality of windows into a 3D model corresponding with the building scan wherein the fourth programmatic instructions for incorporating the detected plurality of windows into a 3D model corresponding with the building scan further comprises:

selecting and regularizing the plurality of detected windows wherein the programmatic instructions are stored on the non-transitory computer readable medium.

12. The computing device program product of claim 11, wherein the second programmatic instructions for processing the building scan generates at least the following:
   a colored point cloud;
   a 2D floor plan of the building; and
   a walked path.

13. The computing device program product of claim 11, wherein the fifth programmatic instructions for decomposing the colored point cloud into the plurality of walls further comprises:
   extruding the plurality of walls from the 2D floor plan;
   determining a scan location of each point in the colored point cloud; and
   ray tracing each point to at least one of the plurality of walls.

14. The computing device program product of claim 11, wherein the sixth programmatic instructions for rotating and pixilating the plurality of walls further comprises:
   rotating each of the plurality of walls to view from a front view; and
   pixilating each of the plurality of walls from the front view.

15. The computing device program product of claim 11, wherein the seventh programmatic instructions for extracting the plurality of transparent features corresponding with the plurality of windows further comprises:
   determining a plurality of rays that intersect each pixel corresponding with the pixilated plurality of walls;
   counting any of the plurality of rays with no return; and
   returning a count corresponding with the counting in a pixel matrix.

16. The computing device program product of claim 11, wherein the eighth programmatic instructions for classifying and smoothing features corresponding with the plurality of windows further comprise:
   applying conditional random field to provide a classification of each pixel corresponding with the pixilated plurality of walls based on the plurality of features of each pixel and surrounding each pixel; and
   outputting the classification in a pixel matrix.

\* \* \* \* \*